US012313951B2

(12) United States Patent
Harris et al.

(10) Patent No.: US 12,313,951 B2
(45) Date of Patent: May 27, 2025

(54) ELECTRO-OPTIC DISPLAY APPARATUS

(71) Applicant: E Ink Corporation, Billerica, MA (US)

(72) Inventors: George G. Harris, Woburn, MA (US); Richard J. Paolini, Jr., Framingham, MA (US)

(73) Assignee: E Ink Corporation, Billerica, MA (US)

( * ) Notice: Subject to any disclaimer, the term of this patent is extended or adjusted under 35 U.S.C. 154(b) by 0 days.

(21) Appl. No.: 17/711,237

(22) Filed: Apr. 1, 2022

(65) Prior Publication Data
US 2022/0221766 A1 Jul. 14, 2022

Related U.S. Application Data

(63) Continuation of application No. 16/826,633, filed on Mar. 23, 2020, now abandoned, which is a
(Continued)

(51) Int. Cl.
G02F 1/16755 (2019.01)
G02F 1/1333 (2006.01)
(Continued)

(52) U.S. Cl.
CPC .... *G02F 1/16755* (2019.01); *G02F 1/133305* (2013.01); *G02F 1/13336* (2013.01);
(Continued)

(58) Field of Classification Search
CPC .. G09G 3/344; G09G 2300/08; G09G 3/3446; G09G 2300/06; G09G 2310/0262;
(Continued)

(56) References Cited

U.S. PATENT DOCUMENTS 4,418,346 A   11/1983   Batchelder
5,760,761 A    6/1998   Sheridon
(Continued)

FOREIGN PATENT DOCUMENTS

JP    H1138395 A     2/1999
JP    2003337550 A   11/2003
(Continued)

OTHER PUBLICATIONS

Wood, D., "An Electrochromic Renaissance?" Information Display, 18(3), 24 (Mar. 2002).
(Continued)

*Primary Examiner* — Brandi N Thomas
(74) *Attorney, Agent, or Firm* — Brian D. Bean

(57) ABSTRACT

A display apparatus including: a plurality of display tiles; a controller configured to control the display tiles; a mounting structure for mounting the plurality of display tiles, the mounting structure including a conductive interconnect layer having a plurality of traces configured to connected the plurality of display tiles to the controller, and a connector connecting at least one display tile to the mounting structure. The at least one display tile is sufficiently flexible to have a curvature, wherein the curvature produces a space between the at least one display tile and the mounting structure to house the controller.

19 Claims, 9 Drawing Sheets

Related U.S. Application Data continuation of application No. 15/618,691, filed on Jun. 9, 2017, now abandoned.

(60) Provisional application No. 62/348,801, filed on Jun. 10, 2016.

(51) Int. Cl.

| | | |
|---|---|---|
| *G02F 1/167* | (2019.01) | |
| *G02F 1/16753* | (2019.01) | |
| *G02F 1/1676* | (2019.01) | |
| *G06F 3/14* | (2006.01) | |
| *H05K 5/00* | (2006.01) | |
| *H05K 5/30* | (2025.01) | |
| *B23K 26/362* | (2014.01) | |
| *G02F 1/1681* | (2019.01) | |

(52) U.S. Cl.
CPC .......... *G02F 1/167* (2013.01); *G02F 1/16753* (2019.01); *G06F 3/1446* (2013.01); *H05K 5/0026* (2013.01); *H05K 5/30* (2025.01); *B23K 26/362* (2013.01); *G02F 1/1676* (2019.01); *G02F 1/1681* (2019.01)

(58) Field of Classification Search
CPC ... G09G 2320/0252; G09G 2300/0426; G09G 2380/04; G09G 2310/068; G09G 2310/06; G09G 2320/02; G09G 2310/061; G09G 2330/021; G09G 3/2074; G09G 2320/0209; G09G 3/035; G09G 2300/0452; G09G 2300/0809; G09G 2300/0852; G09G 2360/144; G09G 3/3406; G09G 2300/026; G09G 2380/06; G09G 2300/04; G09G 2300/0434; G09G 2300/0465; G09G 2320/0247; G09G 2300/0443; G09G 2310/02; G09G 2310/04; G09G 2320/0257; G09G 2380/02; G09G 3/20; G09G 3/2088; G09G 2310/0221; G09G 2310/0267; G09G 2310/0275; G09G 2320/0233; G09G 2320/041; G09G 2330/02; G09G 3/16; G09G 3/2003; G09G 3/2096; G09G 5/006; G09G 2300/023; G09G 2300/0842; G09G 2300/0885; G09G 2310/063; G09G 2320/0276; G09G 3/2007; G09G 3/2018; G09G 3/3208; G09G 3/34; G09G 3/3655; G09G 3/367; G09G 3/38; G09G 2300/043; G09G 2300/0857; G09G 2300/089; G09G 2310/0245; G09G 2310/027; G09G 2310/065; G09G 2320/0204; G09G 2320/0223; G09G 2320/0285; G09G 2320/0613; G09G 2320/0646; G09G 2320/066; G09G 2320/0666; G09G 2320/10; G09G 2330/06; G09G 2340/16; G09G 2380/10; G09G 3/00; G09G 3/02; G09G 3/03; G09G 3/2011; G09G 3/2014; G09G 3/2022; G09G 3/2077; G09G 3/30; G09G 3/3433; G09G 3/3453; G09G 3/3611; G09G 3/3614; G09G 3/3648; G09G 3/3659; G09G 3/3674; G09G 3/3685; G09G 5/14

See application file for complete search history.

(56) References Cited

U.S. PATENT DOCUMENTS

| | | |
|---|---|---|
| 5,777,782 A | 7/1998 | Sheridon |
| 5,808,783 A | 9/1998 | Crowley |
| 5,872,552 A | 2/1999 | Gordon, II et al. |
| 6,054,071 A | 4/2000 | Mikkelsen, Jr. |
| 6,055,091 A | 4/2000 | Sheridon et al. |
| 6,097,531 A | 8/2000 | Sheridon |
| 6,124,851 A | 9/2000 | Jacobson |
| 6,128,124 A | 10/2000 | Silverman |
| 6,130,773 A | 10/2000 | Jacobson et al. |
| 6,130,774 A | 10/2000 | Albert et al. |
| 6,137,467 A | 10/2000 | Sheridon et al. |
| 6,144,361 A | 11/2000 | Gordon, II et al. |
| 6,147,791 A | 11/2000 | Sheridon |
| 6,177,921 B1 | 1/2001 | Comiskey et al. |
| 6,184,856 B1 | 2/2001 | Gordon, II et al. |
| 6,225,971 B1 | 5/2001 | Gordon, II et al. |
| 6,232,950 B1 | 5/2001 | Albert et al. |
| 6,241,921 B1 | 6/2001 | Jacobson et al. |
| 6,252,564 B1 | 6/2001 | Albert et al. |
| 6,271,823 B1 | 8/2001 | Gordon, II et al. |
| 6,301,038 B1 | 10/2001 | Fitzmaurice et al. |
| 6,312,304 B1 | 11/2001 | Duthaler et al. |
| 6,312,971 B1 | 11/2001 | Amundson et al. |
| 6,376,828 B1 | 4/2002 | Comiskey |
| 6,392,786 B1 | 5/2002 | Albert |
| 6,413,790 B1 | 7/2002 | Duthaler et al. |
| 6,422,687 B1 | 7/2002 | Jacobson |
| 6,498,114 B1 | 12/2002 | Amundson et al. |
| 6,506,438 B2 | 1/2003 | Duthaler et al. |
| 6,518,949 B2 | 2/2003 | Drzaic |
| 6,521,489 B2 | 2/2003 | Duthaler et al. |
| 6,545,291 B1 | 4/2003 | Amundson et al. |
| 6,639,578 B1 | 10/2003 | Comiskey et al. |
| 6,657,772 B2 | 12/2003 | Loxley |
| 6,664,944 B1 | 12/2003 | Albert et al. |
| D485,294 S | 1/2004 | Albert |
| 6,672,921 B1 | 1/2004 | Liang et al. |
| 6,683,333 B2 | 1/2004 | Kazlas et al. |
| 6,691,408 B2 | 2/2004 | Biron |
| 6,724,519 B1 | 4/2004 | Comiskey et al. |
| 6,788,449 B2 | 9/2004 | Liang et al. |
| 6,816,147 B2 | 11/2004 | Albert |
| 6,819,471 B2 | 11/2004 | Amundson et al. |
| 6,825,068 B2 | 11/2004 | Denis et al. |
| 6,831,769 B2 | 12/2004 | Holman et al. |
| 6,842,279 B2 | 1/2005 | Amundson |
| 6,842,657 B1 | 1/2005 | Drzaic et al. |
| 6,865,010 B2 | 3/2005 | Duthaler et al. |
| 6,866,760 B2 | 3/2005 | Paolini, Jr. et al. |
| 6,870,657 B1 | 3/2005 | Fitzmaurice et al. |
| 6,873,452 B2 | 3/2005 | Tseng et al. |
| 6,909,532 B2 | 6/2005 | Chung et al. |
| 6,922,276 B2 | 7/2005 | Zhang et al. |
| 6,950,220 B2 | 9/2005 | Abramson et al. |
| 6,967,640 B2 | 11/2005 | Albert et al. |
| 6,980,196 B1 | 12/2005 | Turner et al. |
| 6,982,178 B2 | 1/2006 | LeCain et al. |
| 7,002,728 B2 | 2/2006 | Pullen et al. |
| 7,012,600 B2 | 3/2006 | Zehner et al. |
| 7,012,735 B2 | 3/2006 | Honeyman |
| 7,030,412 B1 | 4/2006 | Drzaic et al. |
| 7,072,095 B2 | 7/2006 | Liang et al. |
| 7,075,502 B1 | 7/2006 | Drzaic et al. |
| 7,075,703 B2 | 7/2006 | O'Neil et al. |
| 7,106,296 B1 | 9/2006 | Jacobson |
| 7,110,163 B2 | 9/2006 | Webber et al. |
| 7,116,318 B2 | 10/2006 | Amundson et al. |
| 7,144,942 B2 | 12/2006 | Zang et al. |
| 7,148,128 B2 | 12/2006 | Jacobson |
| 7,167,155 B1 | 1/2007 | Albert et al. |
| 7,170,670 B2 | 1/2007 | Webber |
| 7,173,752 B2 | 2/2007 | Doshi et al. |
| 7,176,880 B2 | 2/2007 | Amundson et al. |
| 7,190,008 B2 | 3/2007 | Amundson et al. |
| 7,206,119 B2 | 4/2007 | Honeyman et al. |

(56) References Cited

U.S. PATENT DOCUMENTS

| | | |
|---|---|---|
| 7,223,672 B2 | 5/2007 | Kazlas et al. |
| 7,230,751 B2 | 6/2007 | Whitesides et al. |
| 7,236,291 B2 | 6/2007 | Kaga et al. |
| 7,256,766 B2 | 8/2007 | Albert et al. |
| 7,259,744 B2 | 8/2007 | Arango et al. |
| 7,301,693 B2 | 11/2007 | Chaug et al. |
| 7,304,780 B2 | 12/2007 | Liu et al. |
| 7,312,784 B2 | 12/2007 | Baucom et al. |
| 7,321,459 B2 | 1/2008 | Masuda et al. |
| 7,327,346 B2 | 2/2008 | Chung et al. |
| 7,327,511 B2 | 2/2008 | Whitesides et al. |
| 7,347,957 B2 | 3/2008 | Wu et al. |
| 7,352,353 B2 | 4/2008 | Albert et al. |
| 7,365,733 B2 | 4/2008 | Duthaler et al. |
| 7,388,572 B2 | 6/2008 | Duthaler et al. |
| 7,401,758 B2 | 7/2008 | Liang et al. |
| 7,411,719 B2 | 8/2008 | Paolini, Jr. et al. |
| 7,420,549 B2 | 9/2008 | Jacobson et al. |
| 7,432,451 B2 | 10/2008 | Yamada |
| 7,442,587 B2 | 10/2008 | Amundson et al. |
| 7,453,445 B2 | 11/2008 | Amundson |
| 7,492,497 B2 | 2/2009 | Paolini, Jr. et al. |
| 7,535,624 B2 | 5/2009 | Amundson et al. |
| 7,551,346 B2 | 6/2009 | Fazel et al. |
| 7,554,712 B2 | 6/2009 | Patry et al. |
| 7,560,004 B2 | 7/2009 | Pereira et al. |
| 7,583,427 B2 | 9/2009 | Danner et al. |
| 7,598,173 B2 | 10/2009 | Ritenour et al. |
| 7,636,191 B2 | 12/2009 | Duthaler et al. |
| 7,649,674 B2 | 1/2010 | Danner et al. |
| 7,667,886 B2 | 2/2010 | Danner et al. |
| 7,672,040 B2 | 3/2010 | Sohn et al. |
| 7,679,814 B2 | 3/2010 | Paolini, Jr. et al. |
| 7,688,497 B2 | 3/2010 | Danner et al. |
| 7,715,088 B2 | 5/2010 | Liang et al. |
| 7,830,592 B1 | 11/2010 | Sprague et al. |
| 7,839,564 B2 | 11/2010 | Whitesides et al. |
| 7,880,958 B2 | 2/2011 | Zang et al. |
| 7,893,435 B2 | 2/2011 | Kazlas et al. |
| 7,905,977 B2 | 3/2011 | Qi et al. |
| 7,986,450 B2 | 7/2011 | Cao et al. |
| 8,007,286 B1 | 8/2011 | Holec et al. |
| 8,009,348 B2 | 8/2011 | Zehner et al. |
| 8,027,081 B2 | 9/2011 | Danner et al. |
| 8,049,947 B2 | 11/2011 | Danner et al. |
| 8,072,675 B2 | 12/2011 | Lin et al. |
| 8,120,836 B2 | 2/2012 | Lin et al. |
| 8,159,636 B2 | 4/2012 | Sun et al. |
| 8,237,892 B1 | 8/2012 | Sprague et al. |
| 8,362,488 B2 | 1/2013 | Chaug et al. |
| 8,395,836 B2 | 3/2013 | Lin |
| 8,437,069 B2 | 5/2013 | Lin |
| 8,441,414 B2 | 5/2013 | Lin |
| 8,456,589 B1 | 6/2013 | Sprague et al. |
| 8,498,042 B2 | 7/2013 | Danner et al. |
| 8,514,168 B2 | 8/2013 | Chung et al. |
| 8,547,628 B2 | 10/2013 | Wu et al. |
| 8,576,162 B2 | 11/2013 | Kang |
| 8,610,988 B2 | 12/2013 | Zehner et al. |
| 8,714,780 B2 | 5/2014 | Ho et al. |
| 8,728,266 B2 | 5/2014 | Danner et al. |
| 8,743,077 B1 | 6/2014 | Sprague |
| 8,754,859 B2 | 6/2014 | Gates et al. |
| 8,797,258 B2 | 8/2014 | Sprague |
| 8,797,633 B1 | 8/2014 | Sprague et al. |
| 8,797,636 B2 | 8/2014 | Yang et al. |
| 8,929,085 B2 | 1/2015 | Franklin et al. |
| 9,025,234 B2 | 5/2015 | Lin |
| 9,025,238 B2 | 5/2015 | Chan et al. |
| 9,030,374 B2 | 5/2015 | Sprague et al. |
| 9,140,952 B2 | 9/2015 | Sprague et al. |
| 9,147,364 B2 | 9/2015 | Wu et al. |
| 9,152,004 B2 | 10/2015 | Paolini, Jr. et al. |
| 9,201,279 B2 | 12/2015 | Wu et al. |
| 9,223,164 B2 | 12/2015 | Lai et al. |
| 9,279,906 B2 | 3/2016 | Kang |
| 9,285,648 B2 | 3/2016 | Liu et al. |
| 9,310,661 B2 | 4/2016 | Wu et al. |
| 9,454,057 B2 | 9/2016 | Wu et al. |
| 9,529,240 B2 | 12/2016 | Paolini, Jr. et al. |
| 9,582,041 B2 | 2/2017 | Cheng et al. |
| 9,620,066 B2 | 4/2017 | Bishop |
| 9,632,373 B2 | 4/2017 | Huang et al. |
| 9,666,142 B2 | 5/2017 | Hung |
| 9,671,635 B2 | 6/2017 | Paolini, Jr. |
| 9,756,733 B2 | 9/2017 | Drzaic et al. |
| 10,037,735 B2 | 7/2018 | Amundson |
| 10,048,563 B2 | 8/2018 | Paolini, Jr. et al. |
| 10,048,564 B2 | 8/2018 | Paolini, Jr. et al. |
| 10,152,914 B2 | 12/2018 | Meersman et al. |
| 10,190,743 B2 | 1/2019 | Hertel et al. |
| 10,210,794 B2 | 2/2019 | Meersman |
| 10,444,553 B2 | 10/2019 | Laxton |
| 10,446,585 B2 | 10/2019 | Harris et al. |
| 10,466,564 B2 | 11/2019 | Kayal et al. |
| 10,613,407 B2 | 4/2020 | Lin et al. |
| 2002/0060321 A1 | 5/2002 | Kazlas et al. |
| 2004/0085619 A1 | 5/2004 | Wu et al. |
| 2004/0105036 A1 | 6/2004 | Danner et al. |
| 2005/0122306 A1 | 6/2005 | Wilcox et al. |
| 2005/0122563 A1 | 6/2005 | Honeyman et al. |
| 2006/0146271 A1* | 7/2006 | Pennaz ............... G02F 1/1503 |
| | | 349/182 |
| 2006/0255322 A1 | 11/2006 | Wu et al. |
| 2009/0122389 A1 | 5/2009 | Whitesides et al. |
| 2010/0177396 A1 | 7/2010 | Lin |
| 2011/0019370 A1 | 1/2011 | Koh |
| 2011/0176199 A1 | 7/2011 | Sakurai et al. |
| 2011/0292319 A1 | 12/2011 | Cole |
| 2013/0271820 A1* | 10/2013 | Nakahara ............ H05K 3/4007 |
| | | 29/830 |
| 2014/0078024 A1 | 3/2014 | Paolini, Jr. et al. |
| 2014/0192000 A1 | 7/2014 | Hung et al. |
| 2014/0210701 A1 | 7/2014 | Wu et al. |
| 2015/0005720 A1 | 1/2015 | Zang et al. |
| 2016/0012710 A1 | 1/2016 | Lu et al. |
| 2016/0077375 A1 | 3/2016 | Lin |
| 2016/0146271 A1* | 5/2016 | Niffenegger .......... F16D 25/082 |
| | | 192/85.63 |

FOREIGN PATENT DOCUMENTS

| | | |
|---|---|---|
| JP | 2004354468 A | 12/2004 |
| JP | 2007047446 A | 2/2007 |
| JP | 2007248498 A | 9/2007 |
| WO | 1999067678 A2 | 12/1999 |
| WO | 2000005704 A1 | 2/2000 |
| WO | 2000038000 A1 | 6/2000 |

OTHER PUBLICATIONS

O'Regan, B. et al., "A Low Cost, High-efficiency Solar Cell Based on Dye-sensitized colloidal TiO2 Films", Nature, vol. 353, pp. 737-740 (Oct. 24, 1991).

Bach, Udo et al., "Nanomaterials-Based Electrochromics for Paper-Quality Displays", Adv. Mater, vol. 14, No. 11, pp. 845-848, (Jun. 5, 2002).

Hayes, R.A. et al., "Video-Speed Electronic Paper Based on Electrowetting", Nature, vol. 425, No. 25, pp. 383-385 (Sep. 2003).

Kitamura, T. et al., "Electrical toner movement for electronic paper-like display", Asia Display/IDW '01, pp. 1517-1520, Paper HCS1-1 (2001).

Yamaguchi, Y. et al., "Toner display using insulative particles charged triboelectrically", Asia Display/IDW '01, pp. 1729-1730, Paper AMD4-4 (2001).

Korean Intellectual Property Office; PCT/US2017/036759; International Search Report and Written Opinion; Sep. 12, 2017.

* cited by examiner

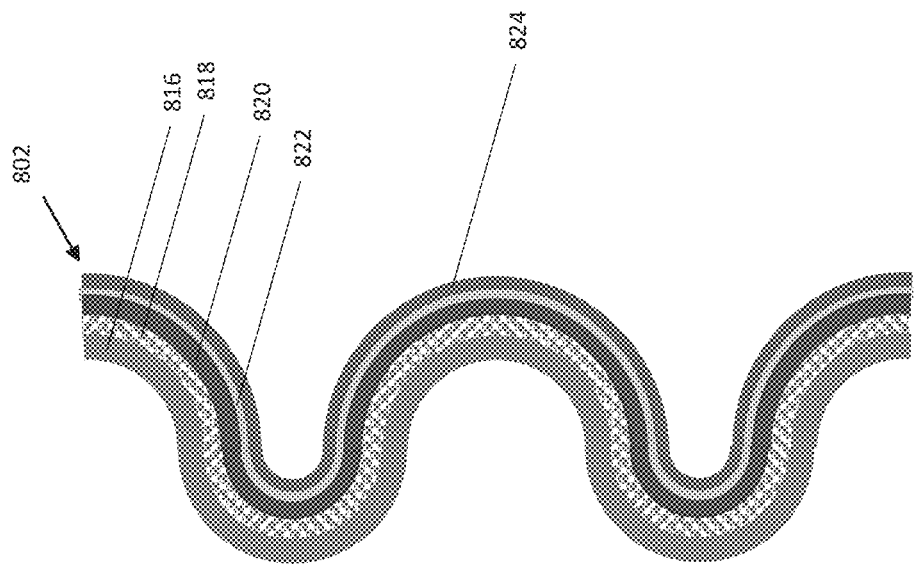
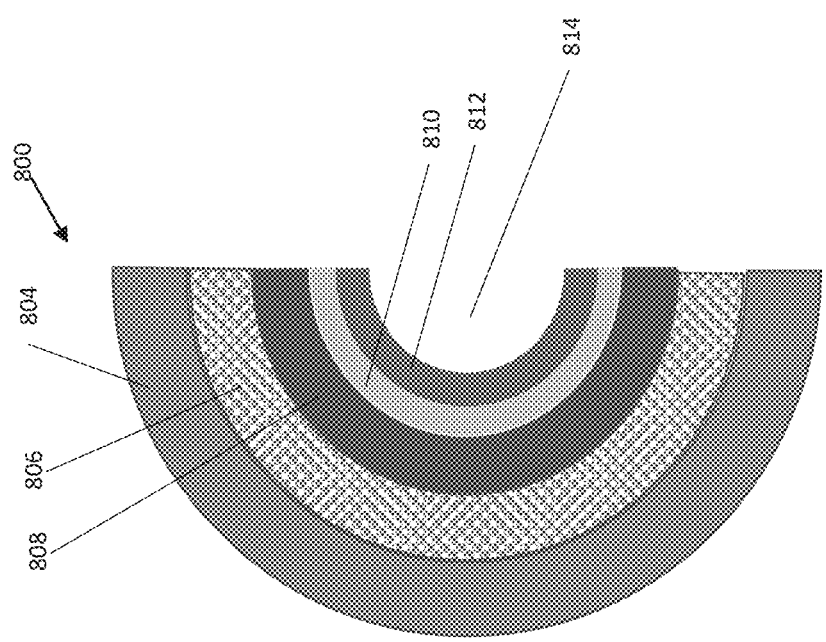

ELECTRO-OPTIC DISPLAY APPARATUS

REFERENCE TO RELATED APPLICATIONS

This application is a continuation of U.S. patent application Ser. No. 16/826,633, filed Mar. 23, 2020, which is a continuation of U.S. patent application Ser. No. 15/618,691 filed on Jun. 9, 2017, now abandoned, which claimed priority to U.S. Provisional Application 62/348,801 filed on Jun. 10, 2016. The entire content of the above mentioned applications and all other patents and publications disclosed herein are incorporated by reference in their entirety.

SUBJECT OF THE INVENTION

This invention relates to electro-optic display apparatus. More specifically, this invention provides means for assembling multiple electro-optic displays into a larger display apparatus in a convenient fashion.

BACKGROUND OF INVENTION

For some display applications it may be desirable to assemble a plurality of electro-optic together to form a larger display screen. To connect the plurality of displays, normally a set of connecting cables are required for connecting each display to an electrical driver unit. Furthermore, one or more alignment frame structures will be required to properly position the displays. The overall assembly of the displays typically will require careful measurements and precise placements of the individual displays. In operation, the connecting cables are either highly customized for individual display apparatus designs, and in addition, customized connection cables can be time-consuming to assemble and be error prone when installing, making this approach suitably only for low volume applications and prototypes. Alternatively, the display connections can include modular subcomponents that are inter-connectable to span the distance between each display and the driver unit. In this fashion, such approach is feasible only for large volume applications where production cost may be averaged down by a large number of displays apparatus produced.

The subject matter presented herein provides means to assemble a plurality of displays into display apparatus of various configurations conveniently and at a low cost.

SUMMARY OF INVENTION

In a first aspect, the present application provides a method for producing a display apparatus having a plurality of display tiles controlled by a controller, the method including: providing a mounting structure with predetermined positions for mounting the plurality of display tiles; producing a conductive interconnect layer having a plurality of traces configured to connected the plurality of display tiles to the controller; mounting at least one display tile to the mounting structure, the at least one display tile being sufficiently flexible to have a curvature such that the curvature produces a space between the at least one display tile and the mounting structure; and placing the controller in the space between the at least one display tile and the mounting structure.

In a second aspect, the present application provides a mounting structure for mounting a plurality of display tiles controlled by a controller, the structure comprising: an insulator layer with through holes matching the placements of the plurality of display tiles; and a conductive interconnect layer configured to connect the plurality of display tiles to the controller, the conductive interconnect layer having plurality of traces extending from the controller to the through holes on the insulator layer.

In a third aspect, the present application provides a display apparatus including: a plurality of display tiles; a controller configured to control the display tiles; a mounting structure for mounting the plurality of display tiles, the mounting structure including a conductive interconnect layer having a plurality of traces configured to connected the plurality of display tiles to the controller, and a connector connecting at least one display tile to the mounting structure. The at least one display tile is sufficiently flexible to have a curvature, wherein the curvature produces a space between the at least one display tile and the mounting structure to house the controller.

BRIEF DESCRIPTION OF DRAWINGS

FIGS. 8A and 8B illustrate flexible display tiles with various curvatures; and

DETAILED DESCRIPTION

Figure 1:
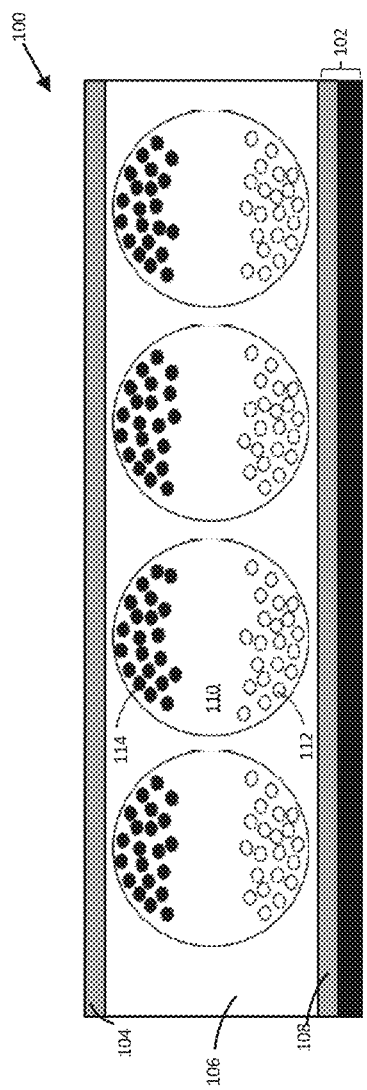
FIG. 1 illustrates an electrophoretic image display in accordance with the subject matter presented herein.

The subject matter presented herein relates to an apparatus for assemble a plurality of electro-optic displays. Such apparatus may include a conductive interconnect layer having a set of printed conductive interconnects for connecting the plurality of displays, and a printed graphics overlay layer for aligning the displays. The electro-optic displays of the present subject matter are especially, but not exclusively, intended for use with particle-based electrophoretic displays in which one or more types of electrically charged particles are suspended in a liquid and are moved through the liquid under the influence of an electric field to change the appearance of the display.

The term "electro-optic" as applied to a material or a display, is used herein in its conventional meaning in the imaging art to refer to a material having first and second display states differing in at least one optical property, the material being changed from its first to its second display state by application of an electric field to the material. Although the optical property is typically color perceptible to the human eye, it may be another optical property, such as optical transmission, reflectance, luminescence or, in the case of displays intended for machine reading, pseudo-color in the sense of a change in reflectance of electromagnetic wavelengths outside the visible range.

The term "gray state" is used herein in its conventional meaning in the imaging art to refer to a state intermediate two extreme optical states of a pixel, and does not necessarily imply a black-white transition between these two extreme states. For example, several of the E Ink patents and published applications referred to below describe electrophoretic displays in which the extreme states are white and deep blue, so that an intermediate "gray state" would actually be pale blue. Indeed, as already mentioned, the change in optical state may not be a color change at all. The terms "black" and "white" may be used hereinafter to refer to the two extreme optical states of a display, and should be understood as normally including extreme optical states which are not strictly black and white, for example, the aforementioned white and dark blue states. The term "monochrome" may be used hereinafter to denote a drive scheme which only drives pixels to their two extreme optical states with no intervening gray states.

Some electro-optic materials are solid in the sense that the materials have solid external surfaces, although the materials may, and often do, have internal liquid- or gas-filled spaces. Such displays using solid electro-optic materials may hereinafter for convenience be referred to as "solid electro-optic displays". Thus, the term "solid electro-optic displays" includes rotating bichromal member displays, encapsulated electrophoretic displays, microcell electrophoretic displays and encapsulated liquid crystal displays.

The terms "bistable" and "bistability" are used herein in their conventional meaning in the art to refer to displays comprising display elements having first and second display states differing in at least one optical property, and such that after any given element has been driven, by means of an addressing pulse of finite duration, to assume either its first or second display state, after the addressing pulse has terminated, that state will persist for at least several times, for example at least four times, the minimum duration of the addressing pulse required to change the state of the display element. It is shown in published US Patent Application No. 2002/0180687 (see also the corresponding International Application Publication No. WO 02/079869) that some particle-based electrophoretic displays capable of gray scale are stable not only in their extreme black and white states but also in their intermediate gray states, and the same is true of some other types of electro-optic displays. This type of display is properly called "multi-stable" rather than bistable, although for convenience the term "bistable" may be used herein to cover both bistable and multi-stable displays.

Several types of electro-optic displays are known. One type of electro-optic display is a rotating bichromal member type as described, for example, in U.S. Pat. Nos. 5,808,783; 5,777,782; 5,760,761; 6,054,071 6,055,091; 6,097,531; 6,128,124; 6,137,467; and 6,147,791 (although this type of display is often referred to as a "rotating bichromal ball" display, the term "rotating bichromal member" is preferred as more accurate since in some of the patents mentioned above the rotating members are not spherical). Such a display uses a large number of small bodies (typically spherical or cylindrical) which have two or more sections with differing optical characteristics and an internal dipole. These bodies are suspended within liquid-filled vacuoles within a matrix, the vacuoles being filled with liquid so that the bodies are free to rotate. The appearance of the display is changed by applying an electric field thereto, thus rotating the bodies to various positions and varying which of the sections of the bodies is seen through a viewing surface. This type of electro-optic medium is typically bistable.

Another type of electro-optic display uses an electrochromic medium, for example, an electrochromic medium in the form of a nanochromic film comprising an electrode formed at least in part from a semi-conducting metal oxide and a plurality of dye molecules capable of reversible color change attached to the electrode; see, for example O'Regan, B., et al., Nature 1991, 353, 737; and Wood, D., Information Display, 18(3), 24 (March 2002). See also Bach, U., et al., Adv. Mater., 2002, 14(11), 845. Nanochromic films of this type are also described, for example, in U.S. Pat. Nos. 6,301,038; 6,870,657; and 6,950,220. This type of medium is also typically bistable.

Another type of electro-optic display is an electro-wetting display developed by Philips and described in Hayes, R. A., et al., "Video-Speed Electronic Paper Based on Electrowetting", Nature, 425, 383-385 (2003). It is shown in U.S. Pat. No. 7,420,549 that such electro-wetting displays can be made bistable.

One type of electro-optic display, which has been the subject of intense research and development for a number of years, is the particle-based electrophoretic display, in which a plurality of charged particles move through a fluid under the influence of an electric field. Electrophoretic displays can have attributes of good brightness and contrast, wide viewing angles, state bistability, and low power consumption when compared with liquid crystal displays. Nevertheless, problems with the long-term image quality of these displays have prevented their widespread usage. For example, particles that make up electrophoretic displays tend to settle, resulting in inadequate service-life for these displays.

As noted above, electrophoretic media require the presence of a fluid. In most prior art electrophoretic media, this fluid is a liquid, but electrophoretic media can be produced using gaseous fluids; see, for example, Kitamura, T., et al., "Electrical toner movement for electronic paper-like display", IDW Japan, 2001, Paper HCS1-1, and Yamaguchi, Y, et al., "Toner display using insulative particles charged triboelectrically", IDW Japan, 2001, Paper AMD4-4). See also U.S. Pat. Nos. 7,321,459 and 7,236,291. Such gas-based electrophoretic media appear to be susceptible to the same types of problems due to particle settling as liquid-based electrophoretic media, when the media are used in an orientation which permits such settling, for example in a sign where the medium is disposed in a vertical plane. Indeed, particle settling appears to be a more serious problem in gas-based electrophoretic media than in liquid-based ones, since the lower viscosity of gaseous suspending fluids as compared with liquid ones allows more rapid settling of the electrophoretic particles.

Numerous patents and applications assigned to or in the names of the Massachusetts Institute of Technology (MIT) and E Ink Corporation have recently been published describing encapsulated electrophoretic media. Such encapsulated media comprise numerous small capsules, each of which itself comprises an internal phase containing electrophoretically-mobile particles suspended in a liquid suspension medium, and a capsule wall surrounding the internal phase. Typically, the capsules are themselves held within a polymeric binder to form a coherent layer positioned between two electrodes. The technologies described in these patents and applications include:

(a) Electrophoretic particles, fluids and fluid additives; see for example U.S. Pat. Nos. 7,002,728 and 7,679,814;

(b) Capsules, binders and encapsulation processes; see for example U.S. Pat. Nos. 6,922,276 and 7,411,719;
(c) Microcell structures, wall materials, and methods of forming microcells; see for example U.S. Pat. Nos. 7,072,095 and 9,279,906;
(d) Methods for filling and sealing microcells; see for example U.S. Pat. Nos. 7,144,942 and 7,715,088;
(e) Films and sub-assemblies containing electro-optic materials; see for example U.S. Pat. Nos. 6,982,178 and 7,839,564;
(f) Backplanes, adhesive layers and other auxiliary layers and methods used in displays; see for example U.S. Pat. Nos. D485,294; 6,124,851; 6,130,773; 6,177,921; 6,232,950; 6,252,564; 6,312,304; 6,312,971; 6,376,828; 6,392,786; 6,413,790; 6,422,687; 6,445,374; 6,480,182; 6,498,114; 6,506,438; 6,518,949; 6,521,489; 6,535,197; 6,545,291; 6,639,578; 6,657,772; 6,664,944; 6,680,725; 6,683,333; 6,724,519; 6,750,473; 6,816,147; 6,819,471; 6,825,068; 6,831,769; 6,842,167; 6,842,279; 6,842,657; 6,865,010; 6,873,452; 6,909,532; 6,967,640; 6,980,196; 7,012,735; 7,030,412; 7,075,703; 7,106,296; 7,110,163; 7,116,318; 7,148,128; 7,167,155; 7,173,752; 7,176,880; 7,190,008; 7,206,119; 7,223,672; 7,230,751; 7,256,766; 7,259,744; 7,280,094; 7,301,693; 7,304,780; 7,327,511; 7,347,957; 7,349,148; 7,352,353; 7,365,394; 7,365,733; 7,382,363; 7,388,572; 7,401,758; 7,442,587; 7,492,497; 7,535,624; 7,551,346; 7,554,712; 7,583,427; 7,598,173; 7,605,799; 7,636,191; 7,649,674; 7,667,886; 7,672,040; 7,688,497; 7,733,335; 7,785,988; 7,830,592; 7,843,626; 7,859,637; 7,880,958; 7,893,435; 7,898,717; 7,905,977; 7,957,053; 7,986,450; 8,009,344; 8,027,081; 8,049,947; 8,072,675; 8,077,141; 8,089,453; 8,120,836; 8,159,636; 8,208,193; 8,237,892; 8,238,021; 8,362,488; 8,373,211; 8,389,381; 8,395,836; 8,437,069; 8,441,414; 8,456,589; 8,498,042; 8,514,168; 8,547,628; 8,576,162; 8,610,988; 8,714,780; 8,728,266; 8,743,077; 8,754,859; 8,797,258; 8,797,633; 8,797,636; 8,830,560; 8,891,155; 8,969,886; 9,147,364; 9,025,234; 9,025,238; 9,030,374; 9,140,952; 9,152,003; 9,152,004; 9,201,279; 9,223,164; 9,285,648; and 9,310,661; and U.S. Patent Applications Publication Nos. 2002/0060321; 2004/0008179; 2004/0085619; 2004/0105036; 2004/0112525; 2005/0122306; 2005/0122563; 2006/0215106; 2006/0255322; 2007/0052757; 2007/0097489; 2007/0109219; 2008/0061300; 2008/0149271; 2009/0122389; 2009/0315044; 2010/0177396; 2011/0140744; 2011/0187683; 2011/0187689; 2011/0292319; 2013/0250397; 2013/0278900; 2014/0078024; 2014/0139501; 2014/0192000; 2014/0210701; 2014/0300837; 2014/0368753; 2014/0376164; 2015/0171112; 2015/0205178; 2015/0226986; 2015/0227018; 2015/0228666; 2015/0261057; 2015/0356927; 2015/0378235; 2016/077375; 2016/0103380; and 2016/0187759; and International Application Publication No. WO 00/38000; European Patents Nos. 1,099,207 B 1 and 1,145,072 B 1;
(g) Color formation and color adjustment; see for example U.S. Pat. Nos. 7,075,502 and 7,839,564;
(h) Methods for driving displays; see for example U.S. Pat. Nos. 7,012,600 and 7,453,445;
(i) Applications of displays; see for example U.S. Pat. Nos. 7,312,784 and 8,009,348; and
(j) Non-electrophoretic displays, as described in U.S. Pat. No. 6,241,921 and U.S. Patent Applications Publication Nos. 2015/0277160, and applications of encapsulation and microcell technology other than displays; see for example U.S. Patent Application Publications Nos. 2015/0005720 and 2016/0012710.

Many of the aforementioned patents and applications recognize that the walls surrounding the discrete microcapsules in an encapsulated electrophoretic medium could be replaced by a continuous phase, thus producing a so-called polymer-dispersed electrophoretic display, in which the electrophoretic medium comprises a plurality of discrete droplets of an electrophoretic fluid and a continuous phase of a polymeric material, and that the discrete droplets of electrophoretic fluid within such a polymer dispersed electrophoretic display may be regarded as capsules or microcapsules even though no discrete capsule membrane is associated with each individual droplet; see for example, the aforementioned U.S. Pat. No. 6,866,760. Accordingly, for purposes of the present application, such polymer-dispersed electrophoretic media are regarded as subspecies of encapsulated electrophoretic media.

A related type of electrophoretic display is a so-called "microcell electrophoretic display". In a microcell electrophoretic display, the charged particles and the fluid are not encapsulated within microcapsules but instead are retained within a plurality of cavities formed within a carrier medium, typically a polymeric film. See, for example, U.S. Pat. Nos. 6,672,921 and 6,788,449, both assigned to Sipix Imaging.

Although electrophoretic media are often opaque (since, for example, in many electrophoretic media, the particles substantially block transmission of visible light through the display) and operate in a reflective mode, many electrophoretic displays can be made to operate in a so-called "shutter mode" in which one display state is substantially opaque and one is light-transmissive. See, for example, U.S. Pat. Nos. 5,872,552; 6,130,774; 6,144,361; 6,172,798; 6,271,823; 6,225,971; and 6,184,856. Dielectrophoretic displays, which are similar to electrophoretic displays but rely upon variations in electric field strength, can operate in a similar mode; see U.S. Pat. No. 4,418,346. Other types of electro-optic displays may also be capable of operating in shutter mode. Electro-optic media operating in shutter mode may be useful in multi-layer structures for full-color displays; in such structures, at least one layer adjacent the viewing surface of the display operates in shutter mode to expose or conceal a second layer more distant from the viewing surface.

The subject matters described herein make it possible to create a display apparatus consisting of a plurality of electro-optic displays or display tiles. In some embodiments, the plurality of electro-optic displays or display tiles may be electrophoretic image displays (EPID). An EPID 100, as illustrated in FIG. 1, may include a backplane 102 having a backplane pixel layer 108 having a plurality of pixel driving electrodes, a front electrode layer 104 and a display layer 106. The display layer 106 may include electrophoretic pigment particles enclosed in micro-capsules or micro-cups. Illustrated in FIG. 1 are micro-capsules comprising black and white electrophoretic pigment particles. The front electrode 104 may represent the viewing side of the EPID 100, in which case the front electrode 104 may be a transparent conductor, such as Indium Tin Oxide (ITO) (which in some cases may be deposited onto a transparent substrate, such as polyethylene terephthalate (PET)). In the display illustrated in FIG. 1, the display layer 106 may be a particle-based medium between layers 104 and 108 that includes a plurality of micro-capsules 110. Within each capsule 110 is a liquid medium and one or more types of colored pigment particles that include white pigment particles 112 and black pigment particles 114. The pigment particles 112 and/or 114 may be controlled (displaced) with an electric field (e.g., produced by electrodes on layers 108 and 104), thus making the display 100 operate as an electrophoretic display when addressed.

As indicated above, the subject matter presented herein provides a mounting structure for mounting electro-optic displays or display tiles. This mounting structure, in some embodiments, may include a substrate for supporting a conductive interconnect layer. This substrate may be sufficiently flexible such that it can be rolled or folded for shipping. In some embodiment, the conductive interconnect layer may be printed. In some other embodiments, the conductive interconnect layer may be laser scribed or physically or mechanically etched, and the substrate will be designed to resist the piercing cutting of the laser and against etching. In yet some other embodiments, the conductive interconnect layer may be produced separately from the mounting substrate and assembled at a later time. The mounting structure may further include an additional substrate for printed graphics overlaying the conductive interconnect layer. This printed graphics substrate may be fabricated from paper or plastic to function as an electrical insulator to protect the underneath conductive interconnect layer.

In one embodiment, once the dimensions and geometrical shapes of the displays have been determined, the placements of the displays and the driver unit can be subsequently determined (e.g., drawn onto) on the mounting structure. To connect the displays and the driver unit, marking traces may be drawn using computer-aided-design software such as AUTOCAD (Registered Trade Mark) or Altium. Conductive interconnects can be subsequently fabricated using the drawn traces as a template. To cover up the conductive interconnects, a layer of printed graphics may be placed on top of the conductive interconnects. Holes or vias may be cut through the layer of printed graphics to allow access to the conductive interconnects. It should be appreciated that the conductive interconnects can be fabricated independently, separate from the other layers, on its own. In this fashion, a designer has the luxury to freely design and fabricate the conductive interconnects to any fitting size and configuration. As such, the designer is not bound by the limitations of any conductive traces producing equipment but is able to freely fabricate interconnects any sizes and shapes that are fitting to the designer's customizations.

Figure 2:
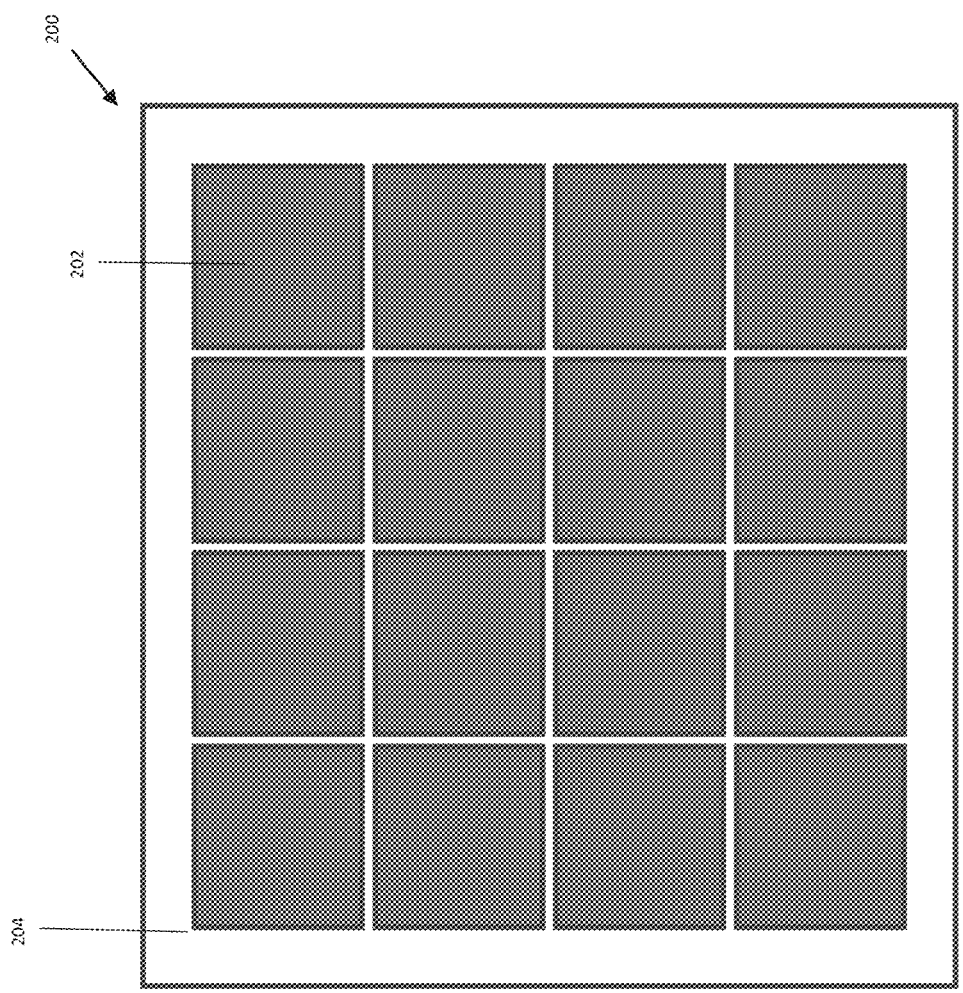
FIG. 2 illustrates an exemplary mounting structure for assembling a plurality of displays in accordance with the subject matter presented herein.

FIG. 2 illustrates a mounting structure 204 where sixteen electro-optic displays or display tiles 202 may be assembled together to form a larger display apparatus 200. In one example, the display tiles 202 can be arranged in a rectangular array (e.g., 4×4) on a mounting structure 204 as shown in FIG. 2, similar in fashion to how tiles are positioned on a wall, with even spacing between the tiles. It should be appreciated that the display tiles' 202 rectangular shapes shown here are for illustrative purposes as the tiles 202 can easily adopt other geometrical shapes. Furthermore, the subject matter disclosed herein enables the display tiles 202 to be arranged and assembled in a variety of configurations. Other than the orderly stacking configuration illustrated in FIG. 2, the display tiles 202 may be arranged, for example, with uneven spacing in between, and in an un-orderly fashion. In some embodiments, the display tiles 202 can be arranged according to a particular formation to form a pre-determined image. Or, designers may place display tiles at their discretion to form specific patterns (e.g., an abstract image etc.).

In addition, each tile may be given a designated code to match a particular position on the mounting structure 204. For example, a display tile (not shown) may be designated 1A to match a predetermined position 1A on the mounting structure 204, and an end user may simply match the tile 1A to the predetermined position 1A when assembling the display apparatus 200.

In some embodiment, the mounting structure 204 may include a substrate for supporting a conductive interconnect layer. This support substrate may be fabricated from a plastic such as poly(ethylene terephthalate) (PET) and have a thickness of at least 2 mils (51 µm-5 mils (127 µm) or above preferred) and is sufficiently flexible to be rolled or folded. In some embodiments, the conductive interconnect layer may be scribed using a beam of energy or particles (e.g., laser) and the support substrate is preferably capable of withstanding the cutting of the laser. Sometimes the conductive interconnects (e.g., traces and/or pads) connecting the display tiles can be made by drawing traces and/or pads between the tiles using continuous conductor such as carbon black or metal-filled ink. Alternatively, interconnecting traces or pads can be mechanically or laser scribed from a conductive layer made out of materials such as Indium Tin Oxide (ITO) or sputtered metal (e.g., aluminum). In yet another embodiment, isolated traces may be printed using techniques such as screen printing, which may be suitable for high volume applications where tolling and other startup expenses may be averaged down.

Furthermore, the mounting structure can also include another substrate for printed graphics and this substrate may be placed over the conductive interconnects layer. This printed graphics substrate layer can be made from paper or plastic and function both as an electrical insulator to protect the underlying conductive interconnects layer and also as a printing surface for the printed graphics. The printed graphics may be produced using ink jet or laser jet printing for uniquely customized designs, or gravure printing for high volume (non-customized) designs. The printed graphics can function as alignment marks during installation as well as provide aesthetic appeal to the display apparatus 200.

To assemble the display apparatus 200, in a preferred embodiment, a designer can firstly determine the sizes and shapes of the display tiles 202. The designer can then decide the placements for each tile and where the conductive interconnects may be placed on each tile. The placements of the tiles 202 and their conductive interconnects may be outlined on the same layer as the printed graphics to simplify installation. Subsequently, the location of the driver unit for the display apparatus may be determined. It is preferred that the driver unit is placed behind one of the display tiles 202. In some embodiments, the display tiles 202 may be curved outwardly away from the mounting structure 204, leaving spaces behind the tiles for the driver unit. Alternatively, the driver unit may be placed away from the tiles 202, for example, hidden behind an enclosure (e.g., a baseboard molding), folded around behind the mounting structure 204 (e.g., above a ceiling tile) or at a location that may be conveniently accessed by display operators.

Figure 3:
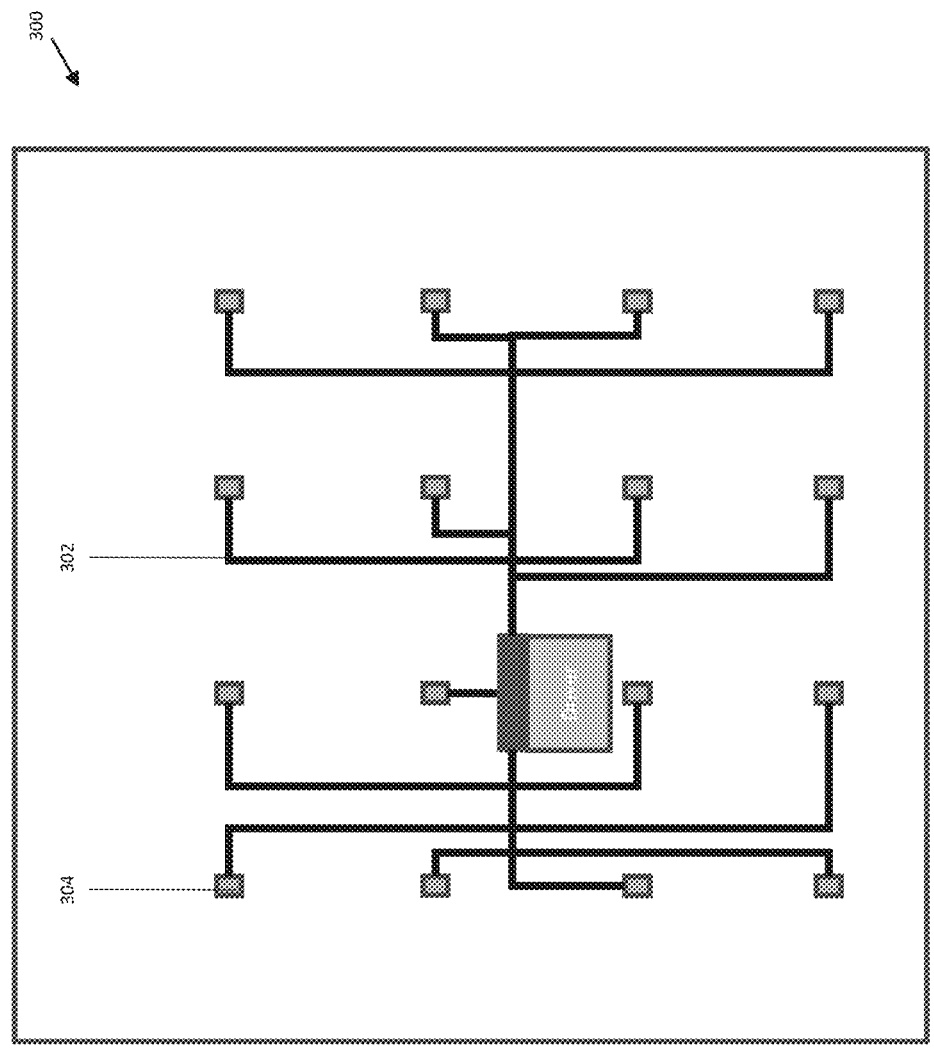
FIG. 3 illustrates a set of conductive interconnects in accordance with the subject matter presented herein.

Once the placements of the display tiles 202 and the driver unit have been determined, marking traces may be drawn connecting the driver unit outputs to the display tiles 202. The marking traces may be drawn using CAD software such as Autocad, Altium, PADS or Adobe Illustrator. In some embodiments, fiducial marks may also be drawn to aid later alignment of the printed graphics to the conductive interconnects (e.g., traces and/or pads). Subsequently, the conductive interconnects may be fabricated using the drawn marking traces as a template. Referring now to FIG. 3, illustrated is a layer of conductive interconnects 300 for providing electrical connections to the display tiles. The conductive interconnect layer 300 may be fabricated by printing traces 302 and pads 304 on a dielectric substrate (e.g., PET) or by scribing a conductive film (e.g., carbon, silver, aluminum, ITO etc.) already deposited on the dielectric substrate. Other methods of fabricating the conductive interconnects 300 may be conveniently adopted here depending on what manufacturing equipment is available to a user. It should be noted that the conductive interconnect layer 300 here may be fabricated separately from all other layers of the display apparatus 100. In this fashion, a designer is free to utilize any method to produce the interconnect layer 300 and not be bound by any interconnect producing equipment. As such, the designer can fabricate interconnects of any shape or sizes as he sees fitting to accommodate his designs. This allows the designer freedom to produce display apparatus of various shapes and configurations and not be bound by the manufacturing limitations of the conductive interconnects.

In use, each display tile may have a connector (e.g., a flat flex connector) port pre-assembled and a matching connector may be placed on a pad 304, in this fashion, when assembling a display apparatus, an user may simply connect the connector on each display tile to the matching connector on the pads 304, thereby eliminate the need to produce connecting cables to connect the plurality of display tiles to the mounting structure, which makes the entire apparatus more compact and convenient to assemble.

Figure 4:
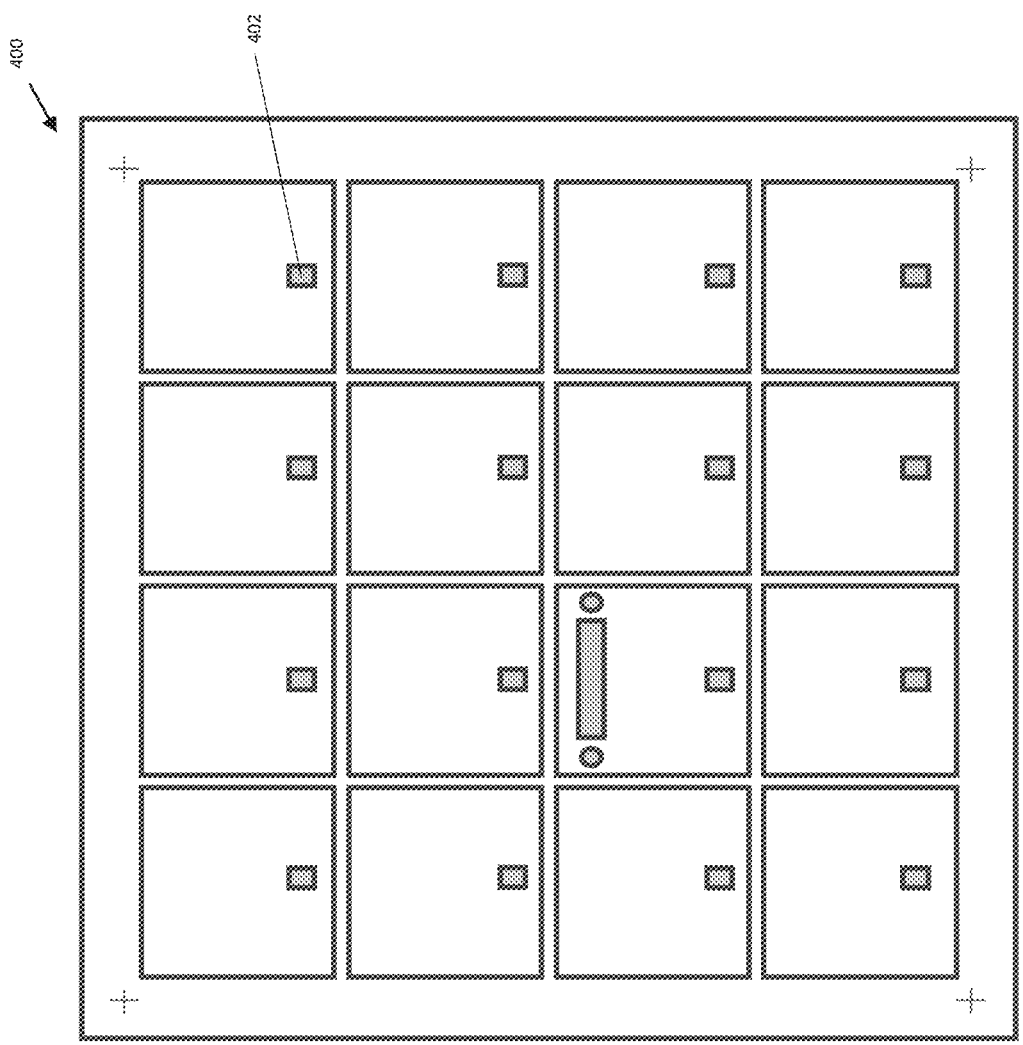
FIG. 4 illustrates a printed graphics layer in accordance with the subject matter presented herein.

Referring now to FIG. 4, illustrated is a printed graphics layer 400 produced on a dielectric substrate which may be later laminated onto the conductive interconnect layer 300 shown in FIG. 3. On the printed graphics layer 400, placements of the display tiles and the driver unit have been outlined, together with through holes 402 for the conductive interconnects. In addition, fiducial or alignment marks may also be drawn on this layer for aligning neighboring interconnect mounting structures if multiple structures or surfaces will be required. Other graphic features such as artistic designs may be further included for aesthetic purposes. Once fabricated, through holes or vias may be cut in this layer 400 to allow access to the conductive interconnects where the driver unit and the display tiles may be connected. The through holes may be made using laser cutting, a die cutter, scissors etc., depending on the designer's preference and electrical connections may be made using conductive pressure sensitive adhesive pads, spring pins, or electrical connections such as crimped pin/socket pairs (i.e., Nicomatic).

In a preferred embodiment, the printed graphics and the conductive interconnects may be adhered (e.g., laminated) either together or separately to the supporting substrate to produce a single piece of mounting structure or surface. Subsequently, the display tiles may be positioned onto the mounting structure at their pre-determined positions. Optionally a mounting frame may also be provided where the mounting structure and the display tiles may be attached to the mounting frame.

Furthermore, the subject matter presented herein also provides for display tiles to be connected to the mounting structure 200 presented in FIG. 2. An exemplary display tile may include a pixel conductor layer, a substrate layer and a reverse side conductor layer, where the substrate layer may be positioned between the pixel conductor layer and the reverse side conductor layer. Driving electrodes for display pixels or pixel segments can be defined and fabricated on the pixel conductor layer. In a preferred embodiment, the driving electrodes are firstly patterned on the pixel conductor layer using a beam of energy or particles (e.g., laser scribing), where laser scribing allows for the fabrication of driving electrodes of various sizes and geometric shapes without using complex machineries. Subsequently, vias can be created through the substrate layer and conductive traces can be drawn on the reverse side conductor layer, where the conductive traces are used for transmitting electrical voltage or driving waveforms to the driving electrodes through the vias. In this fashion, the backplane is assembled without having to use size-limiting techniques such as photolithography or global alignments, techniques usually required by screen printing or PCB manufacturing. As such, large sized backplanes with variable sized driving electrodes can be conveniently and cheaply assembled.

Figure 5:
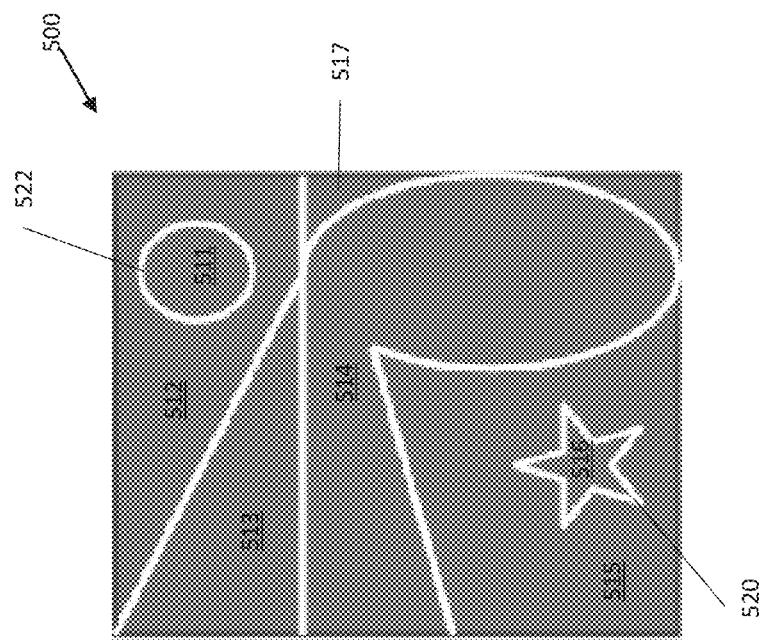
FIG. 5 illustrates an exemplary pixel conductor layer for a display tile with a plurality of irregularly shaped pixel driving electrodes in accordance with the subject matter presented herein.

In some embodiments, specialized display applications will require a display to use pixel or pixel segments of irregular geometric shapes. The present subject matter enables the assembly of a display tile having a plurality of irregular shaped display pixel segments at a cheap price. FIG. 5 illustrates a pixel conductor layer 500 for a display tile having a plurality of irregular shaped pixel segments. As illustrated in FIG. 5, the pixel conductor layer 500 may include a plurality of variable sized driving electrodes 511-517 for driving the plurality of irregular shaped pixel segments (not shown), where the shapes and positions of the driving electrodes 511-517 will match the shapes and positions of the corresponding pixel segments. In some embodiments, the pixel conductor layer 500 may be formed by coating a continuous layer of conducting material such as ITO onto a substrate. Other conductive materials may also be sputtered onto a substrate form the continuous layer, materials such as, but not limited to, various types of conductive oxides, gold, inert metals, nickel boron, carbon, carbon nanotubes, graphene, and poly(3,4-ethylenedioxythiophene) or also known as PEDOT. In some other embodiments, conductive material such as copper, nickel, aluminum, silver nanowires and printed silver may also be used depending on the specific requirements of the display application.

According to some embodiments of the present subject matter, a display tile assembling process may include having a continuous layer of conductive material scribed by a laser to pattern the various shaped driving electrodes 511-517. The scribing may cut deep enough into the conductive material layer to electrically isolate each driving electrodes but not so deep as to cut through the underneath substrate or substantially weaken the substrate to make it fragile. Laser scribing allows for the patterning of driving electrodes of various geometrical configurations without having to perform photolithography or global alignments, which can be prohibitively expensive for large sized displays. FIG. 5 further illustrates star shaped 520 and circular 522 driving electrodes, but it should be appreciated that other geometrical shapes can be easily patterned using laser scribing or other comparable etching methods commonly adopted in the industry.

Figure 6:
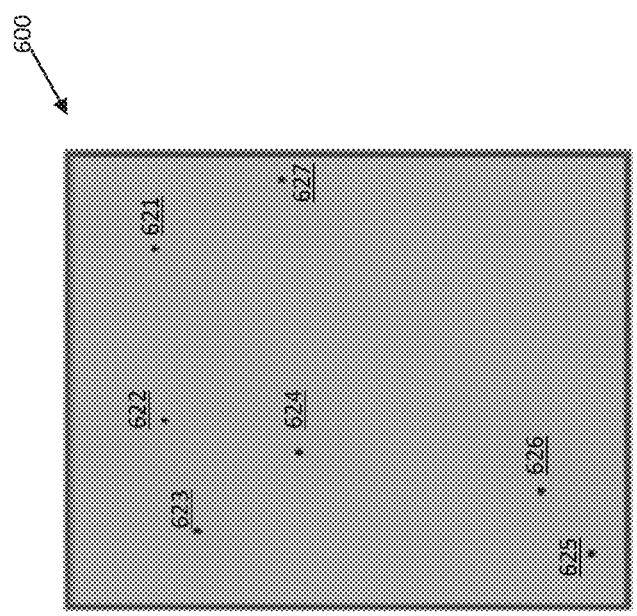
FIG. 6 illustrates an exemplary substrate for a display tile in accordance with the subject matter presented herein.

Once the driving electrodes have been patterned, vias can be created through the substrate to connect the driving electrodes to driver circuits (not shown). FIG. 6 illustrates an exemplary substrate layer 600 in accordance with the subject matter presented herein. In some embodiments, the substrate layer 600 may be manufactured using materials such as PET, Polyethylene naphthalate (PEN), cyclic olefins, paper, fabrics, polyimide, or polycarbonate. To provide electrical connections to the driving electrodes 511-517 as shown in FIG. 5, one or more vias 621-627 may be created through the substrate layer 600 for each of the driving electrodes 511-517. Vias 621-627 may be created by cutting through the substrate layer 600 using lasers, but it should be appreciated that mechanical drilling or other puncturing methods commonly used in the art can be easily adopted. In some embodiments, a via cut into a driving electrode may be at least 200 μm in diameter and usually no more than 3 mm to minimize the appearance of the hole in the final display. It should appreciated that in other embodiments, vias may be formed before the driving electrodes have been patterned, for example, a substrate may come pre-fabricated with vias in place configured to backplane assembling.

Once the vias 621-627 have been created, conductive material (not shown) may be dispensed into the vias 621-627 with a porous paper behind the substrate and with vacuum pulling on the porous paper. The vacuum force will pull the conductive material through the vias 621-627 and plates the sides of the vias 621-627 or fill the volume of the vias 621-627, connecting the driving electrodes 511-517 to the reverse side of the substrate 600. It is preferred that the finished vias have surfaces co-planar with both the pixel conductor layer and the reverse side conductor layer to avoid bumps resulting from too much filler or lamination void due to insufficient via filling. In some embodiments, the vias 621-627 may be filled with a hot melt adhesive with a melting temperature around the lamination temperature of the electrophoretic ink material (e.g., 250F), provided that the flow viscosity of the hot melt adhesive is low enough to prevent ink capsule rupture.

The properly filled vias 621-627 can provide electrical connections between the driving electrodes 511-517 and the conductive traces that are to be formed on the reverse side (i.e., the side opposite to the pixel conductor layer) of the substrate 600. Prior to the formation of the conductive traces, in some embodiments, an ink FPL stack (not shown) may be firstly laminated to the driving electrodes 511-517. This is done in this fashion such that the thickness of the traces would not press through the substrate 600 and make impressions on the FPL layer during lamination.

The subsequent formation of the conductive traces may be carried out in various fashions. In some embodiments, conductive traces may be printed onto the reverse side beginning at the vias and extend according to a pre-determined layout for routing all of the lines from the pixel locations, without crossing, to one condensed area that matches the pad pitch for the electronics to be attached to the device. The printing of the conductive traces may be accomplished manually for small numbers of backplane units, or alternatively, an XY plotting machine with controlled dispensing of printable conductive material may be used. Camera vision alignment may be adopted to locate the vias and a XY plotter may be aligned to that location to start drawing the conductive traces. It should be appreciated that other trace producing methods commonly used in the industry can be conveniently adopted, methods such as, but not limited to, inkjet with conductive inks, rollers, tapes, etc. Some examples of suitable trace materials are silver or carbon filled printing inks. In this fashion, no global alignment may be required to create the conductive traces. For example, local alignment may be perfectly sufficient to places the traces to connect the vias to a driver circuit. By not having to perform global alignments, large sized (e.g., backplanes larger than 24 inches by 48 inches in sizes) backplanes can be conveniently assembled because global alignments can be hard to design for and expensive to perform.

In some other embodiment, the conductive traces may be fabricated (e.g., printed) as a conductive interconnect layer. The conductive interconnect layer may be produced separately from the substrate 600 and the pixel conductor layer 500, and to be assembled together when a display tile is being assembled.

Figure 7:
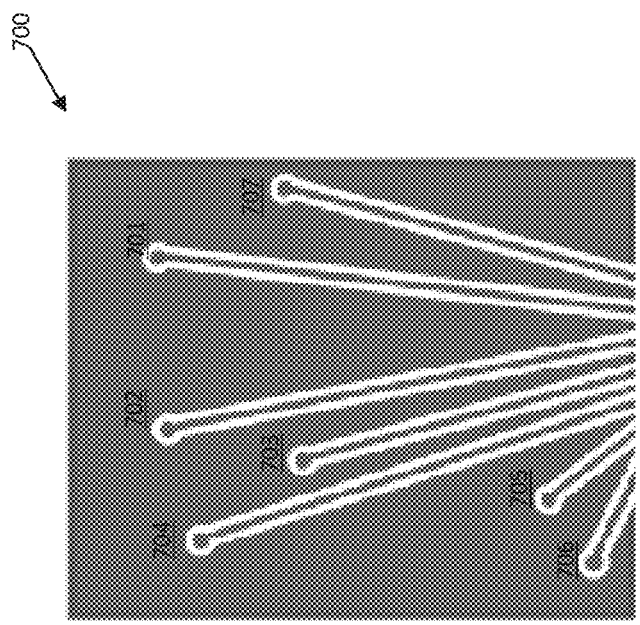
FIG. 7 illustrates a reverse side conductor layer with conductive traces in accordance with the subject matter presented herein.

Alternatively, conductive traces may be etched or scribed onto a continuous conductive layer, similar to the patterning of the driving electrodes 511-517 mentioned above. In some embodiments, a continuous layer of conductive material may be coated on the reverse side of the substrate 600. After the FPL stack has been laminated onto the driving electrodes 511-517, conductive traces may be etched into the continuous conductive layer with a laser such that each conductive trace is electrically isolated but not cutting into the substrate enough to cut through or make it fragile. FIG. 7 illustrates an exemplary reverse side conductor layer 700 with conductive traces 701-707. The conductor layer 700 may be produced as a printed layer of conductive circuitry, or by etching onto a continuous layer of conductive material. In the case it is produced by etching, the cutting of each conductive trace can include the via for the driving electrode and a circular structure around the via adding the width of the conductive trace around each via to ensure continuity to that driving electrode. The alignment to each via may be accomplished with a camera vision alignment system to find and align to each via to locate the conductive trace path. The conductive traces 701-707 can extend in a pre-determined layout for routing all of the lines from the pixel locations, without crossing, to one condensed area that matches the pad pitch for the electronics to be attached to the device.

For conductive fabric designs, it may be convenient to firstly produce patterns for the driving electrodes and the conductive traces, then paste them onto a substrate which could be a fabric or film depending on the requirements of the display application. Other suitable substrate material include PET, Polyethylene naphthalate (PEN), cyclic olefins, paper, fabrics, polyimide, or polycarbonate, etc.

In general, variations can be made to the backplane assembly processes described above while still produce backplanes that are substantially comparable in performances. For example, roll to roll machines may be used to assemble backplanes that are in accordance with the subject matter presented herein. In some embodiments, continuous rolls of substrate coated with conductive materials can be processed at multiple assembling stations including a laser cutting/etching station and a XY plotting station, both equipped with camera vision alignment systems. These two stations may be distinct units or may be part of a single assembly station (e.g., both the laser cutter and the plotter can be part of an XY gantry system). Furthermore, a roll to roll machine may further include a station for heated lamination of ink FPL or other materials for assembling display units. This arrangement can be advantageous for at least the reason that the conductive traces can now be radiation cured (e.g., UV cured) at the roll to roll machine, which saves production time and cost by not having to use conventional heat drying ovens.

In another embodiment, vias can be cut in a substrate roll prior to the deposition of conductive materials, which permits the filling of the vias using the deposited conductive material. In this fashion, a separate assembling step to fill the vias may be eliminated, further reducing production cost.

In yet another embodiment, vias may be left unfilled prior to the lamination of the FPL to a display stack. The subsequent dispensing of the conductive traces to the reverse side of the substrate can in effect fulfill the vias to provide connection between the driving electrodes and the conductive traces.

It should be appreciated that the pixel conductor layer, a substrate layer and a reverse side conductor layer presented above may be produced using flexible material, resulting in a display tile that is bendable or flexible. In addition, the flexible nature and robustness of the electrophoretic material enables the display tile to be not only flexible, but capable of having multiple curvatures. FIG. 8A illustrates one such flexible display tile 800. The display tile 800 shown here may be sufficiently flexible to be curved to a half-circular shape, where the tile's 800 front electrode 804 may be produced using flexible material common adopted in the industry. The pixel conductor layer 808, the substrate layer 810 and the reverse side conductor layer 812 all may be fabricated from materials sufficiently flexible to support a layer of electrophoretic display material 806. The curved shape of display tile 800 produces a space 814 adjacent to the reversed side conductor layer 812 such that when assembled to a mounting structure similar to the one illustrated in FIG. 2 a controller apparatus (e.g., display controller or control circuit) may be positioned or housed in that space 814, hiding from the view and preserves the overall compactness of the overall display apparatus.

In another embodiment shown in FIG. 8B, a flexible display tile 802 may include multiple curvatures. The multiple layers of the display tile 802 (e.g., the front electrode 816, the electrophoretic material layer 816, the pixel conductor layer 820, the substrate layer 822 and the reverse side conductor layer 824) may be sufficiently flexible to assume various curvatures to suit a designer's needs.

Figure 9:
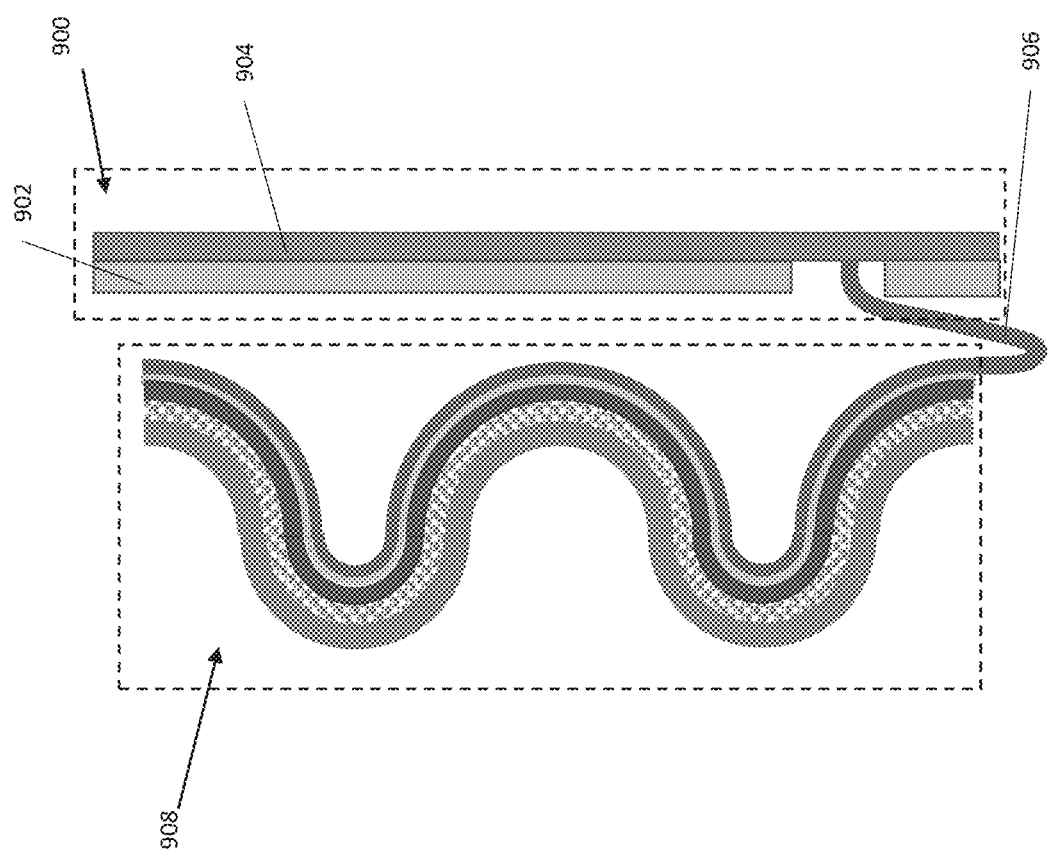
FIG. 9 illustrates a flexible display tile mounted onto a mounting structure.

FIG. 9 illustrates a flexible display tile 908 that is similar to the one presented in FIG. 8B being assembled onto a mounting structure 900. The mounting structure 900, as discussed above, may include a conductive interconnect layer 904 with conductive traces for providing electrical connections to the display tile 908. A printed graphic layer 902 may be positioned between the interconnect layer 904 and the display tile 908 for insulation. A connector 906 may be used to connect the display tile 908 to the interconnect layer 904. The connector 906 may have a short wire for flexibility, or may be a snap on type connector, or any connector commonly adopted in the industry, saving a user from having to use cables to connect individual tiles to the mounting structure.

From the foregoing, it will be seen that the present invention provides means for inexpensive customization and quick turn-around manufacturing of tiled display systems or apparatus. The present invention eliminates the need for labor-intensive custom cable fabrication and greatly simplifies the installation process. The subject matter described herein also eliminates the need for cable management and improves the aesthetics of the entire installation process. Also reduced is the overall thickness of the display apparatus, as there is no more need for extra spaces for passing cables behind the display tiles. Furthermore, this invention also allows for tiles to be placed non-adjacent to each other, as the electrical connections are hidden behind the printed graphics layer.

It will be apparent to those skilled in the art that numerous changes and modifications can be made to the specific embodiments of the invention described above without departing from the scope of the invention. Accordingly, the whole of the foregoing description is to be interpreted in an illustrative and not in a limitative sense.

The invention claimed is:

1. A method of forming a patterned electrophoretic display comprising in order from top to bottom:
    a front electrode comprising a transparent conductor,
    a display layer including encapsulated electrophoretic pigment particles in a fluid, and
    a plurality of patterned drive electrodes, wherein the front electrode overlaps two or more of the drive electrodes, the method comprising:
    providing a substrate coupled to a continuous conductor layer;
    patterning the continuous conductor layer with a laser to create the plurality of patterned drive electrodes;
    providing a front plane laminate (FPL) comprising the front electrode comprising a transparent conductor and the display layer including encapsulated electrophoretic pigment particles in a fluid; and
    coupling the front plane laminate to the substrate including the plurality of patterned drive electrodes.

2. The method of claim 1, further comprising coupling a reverse side conductor layer to the substrate layer on a side of the substrate opposite to the side of the substrate coupled to the continuous conductor layer.

3. The method of claim 1, wherein the substrate includes conductive vias and the reverse side conductor forms conductive traces between a voltage source and the plurality of patterned drive electrodes.

4. The method of claim 1, wherein the plurality of patterned drive electrodes is formed by patterning the continuous conductor layer but not patterning the substrate layer.

5. The method of claim 1, wherein the plurality of patterned drive electrodes is formed by simultaneously patterning the continuous conductor layer and the substrate layer.

6. The method of claim 1, wherein the substrate comprises polyethylene terephthalate (PET), polyethylene naphthalate (PEN), cyclic olefins, paper, fabric, polyimide, or polycarbonate.

7. The method of claim 1, wherein the continuous conductor layer comprises indium tin oxide (ITO), gold, nickel boron, carbon, carbon nanotubes, graphene, or poly(3,4-ethylenedioxythiophene) (PEDOT).

8. A patterned electrophoretic display comprising in order from top to bottom:
    a front electrode comprising a transparent conductor;
    a display layer including encapsulated electrophoretic pigment particles in a fluid;
    a plurality of patterned drive electrodes formed by patterning a continuous conductor layer with a laser, wherein the front electrode overlaps two or more of the plurality of patterned drive electrodes; and
    a substrate layer coupled to the plurality of patterned drive electrodes.

9. The patterned electrophoretic display of claim 8, further comprising a reverse side conductor layer coupled to the substrate layer on a side of the substrate opposite to the side of the substrate coupled to the continuous conductor layer.

10. The patterned electrophoretic display of claim 9, wherein the substrate layer comprises vias between the plurality of patterned drive electrodes and the reverse side conductor layer.

11. The patterned electrophoretic display of claim 10, wherein the vias are filled with a conductive material.

12. The patterned electrophoretic display of claim 8, wherein the electrophoretic pigment particles and the fluid are encapsulated in microcapsules.

13. The patterned electrophoretic display of claim 8, wherein the electrophoretic pigment particles and the fluid are encapsulated in microcells.

14. The patterned electrophoretic display of claim 8, wherein the electrophoretic pigment particles are charged and move through the fluid under the influence of an electric field to change the appearance of the patterned electrophoretic display.

15. The patterned electrophoretic display of claim 8, wherein the plurality of patterned drive electrodes is formed by patterning the continuous conductor layer after the continuous conductor layer is coupled to the substrate layer.

16. The patterned electrophoretic display of claim 15, wherein the plurality of patterned drive electrodes is formed by patterning the continuous conductor layer but not patterning the substrate layer.

17. The patterned electrophoretic display of claim 15, wherein the plurality of patterned drive electrodes is formed by simultaneously patterning the continuous conductor layer and the substrate layer.

18. The patterned electrophoretic display of claim 8, wherein the substrate comprises polyethylene terephthalate (PET), polyethylene naphthalate (PEN), cyclic olefins, paper, fabric, polyimide, or polycarbonate.

19. The patterned electrophoretic display of claim 8, wherein the continuous conductor layer comprises indium tin oxide (ITO), gold, nickel boron, carbon, carbon nanotubes, graphene, or poly(3,4-ethylenedioxythiophene) (PEDOT).

* * * * *